(12) United States Patent
Babich et al.

(10) Patent No.: US 7,175,966 B2
(45) Date of Patent: Feb. 13, 2007

(54) WATER AND AQUEOUS BASE SOLUBLE ANTIREFLECTIVE COATING/HARDMASK MATERIALS

(75) Inventors: Katherina E Babich, Chappaqua, NY (US); Alfred Grill, White Plains, NY (US); Arpan P Mahorowala, Bronxville, NY (US); Dirk P Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 10/666,541

(22) Filed: Sep. 19, 2003

(65) Prior Publication Data

US 2005/0064322 A1 Mar. 24, 2005

(51) Int. Cl.
 *G03F 7/00* (2006.01)
 *G03F 7/075* (2006.01)
 *G03F 7/11* (2006.01)
(52) U.S. Cl. ............... 430/271.1; 430/272.1; 430/313; 430/11; 438/712; 438/789
(58) Field of Classification Search ............ 430/271.1, 430/272.1, 311, 313; 438/712, 789
See application file for complete search history.

(56) References Cited

U.S. PATENT DOCUMENTS

| 6,045,650 | A  | * | 4/2000 | Mitchnick et al. ........... 156/279 |
|---|---|---|---|---|
| 6,316,167 | B1 |   | 11/2001 | Angelopoulos et al. ..... 430/313 |
| 6,320,202 | B1 | * | 11/2001 | Banerjee et al. ............... 257/65 |
| 6,500,772 | B2 | * | 12/2002 | Chakravarti et al. ......... 438/789 |
| 6,514,667 | B2 |   | 2/2003 | Angelopoulos et al. .. 430/271.1 |
| 6,713,835 | B1 | * | 3/2004 | Horak et al. ................. 257/522 |
| 6,730,576 | B1 | * | 5/2004 | Wang et al. ................. 438/413 |
| 6,768,200 | B2 | * | 7/2004 | Grill et al. ................... 257/758 |
| 6,787,864 | B2 | * | 9/2004 | Paton et al. ................. 257/412 |
| 6,821,825 | B2 | * | 11/2004 | Todd et al. .................. 438/150 |

* cited by examiner

*Primary Examiner*—Amanda C Walke
(74) *Attorney, Agent, or Firm*—Ohlandt, Greeley, Ruggiero & Perle, L.L.P.

(57) ABSTRACT

A multilayer lithographic structure which includes a substrate, having on a major surface thereof a first layer including a water and/or aqueous base soluble material which includes Ge, O, and H, and optionally X, wherein X is at least one of Si, N, and F; and disposed on the first layer a second layer which includes an energy photoactive material.

40 Claims, 10 Drawing Sheets

WATER AND AQUEOUS BASE SOLUBLE ANTIREFLECTIVE COATING/HARDMASK MATERIALS

BACKGROUND OF THE INVENTION

1. Field of the Invention

The present invention relates to films for use as antireflective coatings and hardmasks for lithographic structures. More particularly, the present invention relates to optically tunable, water and/or aqueous base soluble materials for use as antireflective coatings, hardmasks, and combined antireflective coating/hardmasks.

2. Description of the Prior Art

The need to remain cost and performance competitive in the production of semiconductor devices has driven the industry to a continuing increase in device density with a concomitant decrease in device geometry. To facilitate the shrinking device dimensions, new lithographic materials, processes and tools are being considered. Currently, 248 nm lithography is being pursued to print sub-200 nm features. To do this, tools with higher numerical aperture (NA) are emerging. The higher NA allows for improved resolution but reduces the depth of focus of aerial images projected onto the resist. Because of the reduced depth of focus, a thinner resist will be required. As the thickness of the resist is decreased, the resist becomes less effective as a mask for subsequent dry etch image transfer to the underlying substrate, i.e. most if not all of the resist is etched away during the subsequent pattern transfer process. Without significant improvement in the etch selectivity exhibited by current single layer resists (SLR), these systems cannot provide the necessary lithographic and etch properties for high-resolution lithography.

Typical resist structures consist of a resist on top of an antireflective coating (ARC). The resist is exposed and developed and the image is then transferred through the ARC and then through the underlying layers, such as oxide, nitride or silicon layers. Typical resist thickness is on the order of 5000 A for the current state-of-the-art lithography process. During the ARC open, significant resist is lost as the etch selectivity between the resist and ARC is at best 1:1. As minimum features continue to decrease, it is desirable to thin the resist to attain the high resolution as well as improved process window (exposure and focus latitude). However, thinning the resist below 5000 A poses etch problems. There may be insufficient resist to function as an etch mask for subsequent transfer etch into underlying layer. Compounding this problem is the fact that significant resist loss also occurs during the ARC open.

Another problem with single layer resist systems is critical dimension (CD) control. Substrate reflections at ultraviolet (UV) and deep ultraviolet (DUV) wavelengths are notorious for producing standing wave effects and resist notching, which severely limit CD control of single layer resists. Notching results from substrate topography and non-uniform substrate reflectivity, which causes local variations in exposure energy on the resist. Standing waves are thin film interference (TFI) or periodic variations of light intensity through the resist thickness. These light variations are introduced because planarization of the resist presents different thickness through the underlying topography. Thin film interference plays a dominant role in CD control of single layer photoresist processes, causing large changes in the effective exposure dose due to a tiny change in optical phase. Thin film interference effects are described in "Optimization of optical properties of resist processes" (T. Brunner, SPIE Proceedings Vol. 1466, p. 297, 1991), the teaching of which is incorporated herein by reference.

Bottom anti-reflective coatings or BARCs have been used with single layer resists to reduce thin film interference. However, these thin absorbing BARCs have fundamental limitations. These materials are generally spin applied. The thickness of the BARC and the resist cannot be controlled to the accuracy required to operate at the target thickness to achieve minimum reflectance. The resist thickness can also vary due to existing topography. Thin underlying films such as silicon nitride or silicon oxide tend to exhibit some thickness non-uniformity after deposition. The thin BARC will generally not effectively planarize these thin underlying films. Thus, as a result there will be a variation in exposure energy into the resist. Current trends to reduce topography via chemical/mechanical polishing still leave significant variations in film thickness over topography.

To overcome some of the limitations of single layer resists, thin film imaging techniques have been developed including bilayer resists, trilayer resist systems and top surface imaging (TSI). In a bilayer structure, a thin resist containing Si functionality for etch resistance is coated on top of a thick polymer layer with suitable absorption at the exposing wavelength to act as a BARC and suitable etch resistance for substrate etch. Because of the thick resist/underlayer stack, this technique offers tremendous advantage for etch transfer. However, incorporation of Si moieties into the imaging resist structure is very challenging and can result in limited resolution and low performance of such resist systems. All of these thin film imaging techniques are more complex and costly than current single layer resist processes.

The importance of hardmask technology is becoming increasingly evident as the demand for high-resolution imaging dictates the use of ever-thinner resist films. An appropriately designed etch resistant hardmask used in conjunction with a thin resist can provide the combined lithographic and etch performance needed for sub-100 nm device fabrication. Plasma-enhanced chemical vapor deposition (PECVD) prepared materials that perform both as an antireflective coating (ARC) and hardmask offer several advantages over organic bottom antireflective coatings (BARC) currently used for manufacturing of logic and memory chips. These benefits include excellent tunability of the material's optical properties, which allows superior substrate reflectivity control, high etch selectivity to resist, exceeding 2:1 due to the significant difference in chemical composition between resist and PECVD deposited material. In addition, PECVD deposited materials are highly crosslinked covalent networks which are considerably denser compared to organic materials thus can serve as an effective hardmask etch barrier during the plasma etching of dielectric stacks. In contrast, organic BARCs have poor optical tunability, which means that their index of refraction, n, and the extinction coefficient, k, cannot be finely tuned to match resist and substrate optical properties. Additionally, organic BARCs have chemical composition very similar to resist materials which results in poor etch selectivity of about or less than 1:1 between resist and BARC to resist. Thus, about 100 nm of the resist is consumed during ARC open, with high-resolution imaging, this becomes a fundamental process limitation.

Recently, considerable interest has been focused on PECVD prepared ARC/hardmask materials as they offer tremendous leverage for extending optical lithography to sub 100 nm resolution. Such materials are described in U.S. Pat. Nos. 6,316,167 and 6,514,667. Typically, ARC/hardmask materials must be removed after the lithographic patterning is complete as their presence in the final device structure can adversely affect the device performance. The PECVD ARC/hardmask materials described in these two patents are highly cross-linked covalent networks which are significantly dense compared to organic polymer films and hence difficult to remove with conventional wet and dry strip processes without damaging the layers underneath. This significantly limits their use in semiconductor processing.

Depending on the particular integration structure, PECVD ARC/hardmask materials must be removed from the structure selective to one or more substrate materials. The substrate can be a dielectric material e.g. silicon oxide or silicon nitride, low dielectric constant materials e.g. SiCOH and ultra-low dielectric constant materials e.g. porous SiCOH and/or a semiconductor such as polysilicon and/or a metal e.g. copper, aluminum. Improved ARC/hardmask materials that can be selectively removed are needed.

It is desirable to develop a thin resist process which provides excellent lithographic performance and provides appropriate etch resistance for effective pattern transfer into the underlying substrate. In order to do this, improved ARC/hardmask materials are needed which provide better etch selectivity to resist than current organic BARCs. The ARC/hardmask material needs to (1) have appropriate optical properties to function as a suitable ARC at appropriate wavelength, (2) provide good etch selectivity to resist (greater than 1:1), and (3) does not interact with the resist inducing residue, footing, undercut thereby limiting the overall lithographic performance of the resist. It is also desirable that the ARC/hardmask material also function as a suitable hard mask material for the underlayer etch. Germanium based ARC/hardmask materials prepared by PECVD processes and spin coating processes whose properties are tailored to allow selective removal of these materials from the structure in water or aqueous base solutions are disclosed herein.

SUMMARY OF THE INVENTION

The present invention provides a multilayer lithographic structure which includes a substrate, having on a major surface thereof a first layer including a water and/or aqueous base soluble material which includes Ge, O, and H, and optionally X, wherein X is at least one of Si, N, and F; and disposed on the first layer a second layer which includes an energy photoactive material.

The present invention further provides a method of making a lithographic structure which includes depositing on a surface of a substrate a first layer which includes a water and/or aqueous base soluble material which includes Ge, O, and H, and optionally X, wherein X is at least one of Si, N, and F; and depositing on the first layer a second layer which includes an energy photoactive material.

The present invention still further provides a film for a lithographic structure which includes a water and/or aqueous base soluble material comprising Ge, O, and H, and optionally X, wherein X is at least one of Si, N, and F.

DETAILED DESCRIPTION OF THE INVENTION

Figure 1A:
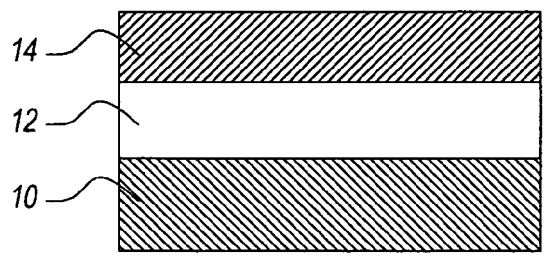
FIG. 1 shows four basic lithographic structures according to the present invention.
Figure 1B:
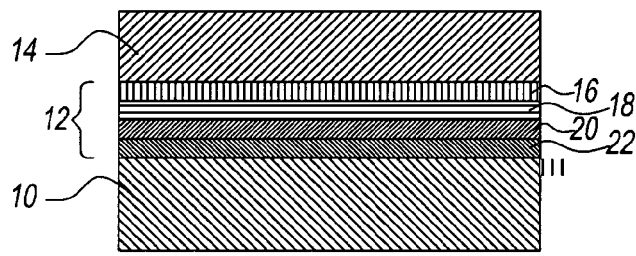
Figure 1C:
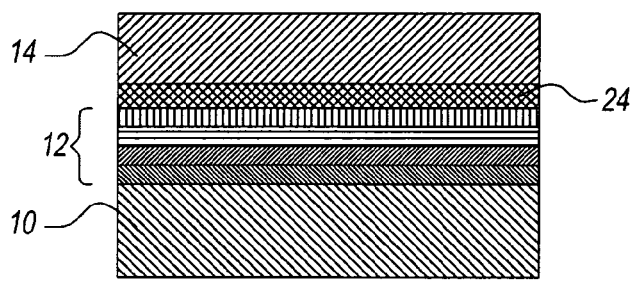
Figure 1D:
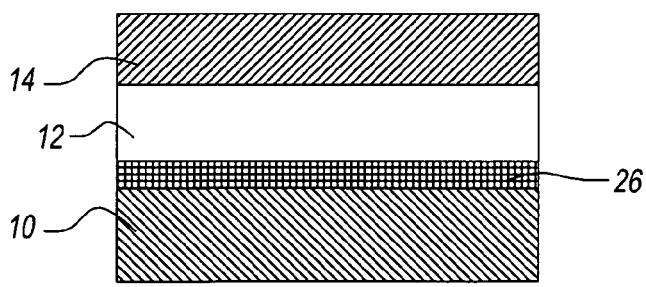

The present invention provides a multilayer lithographic structure which includes a substrate, having on a major surface thereof a first layer including a water and/or aqueous base soluble material which includes Ge, O, and H, and optionally X, wherein X is at least one of Si, N, and F; and disposed on the first layer a second layer which includes an energy photoactive material.

The present invention further provides a method of making a lithographic structure which includes depositing on a surface of a substrate a first layer including a water and/or aqueous base soluble material which includes Ge, O, and H, and optionally X, wherein X is at least one of Si, N, and F; and depositing on the first layer a second layer which includes an energy photoactive material.

The present invention still further provides a film for a lithographic structure including a water and/or aqueous base soluble material which includes Ge, O, and H, and optionally X, wherein X is at least one of Si, N, and F.

The materials or films that are useful to practice the present invention include Ge, O, and H, and optionally X, wherein X is selected from at least one of Si, N, and F. These films (GeOHX films) can be used in a lithographic structure as a first layer between a substrate and a second layer having an energy photoactive material. These materials are soluble in water and/or an aqueous base. These materials can perform a variety of functions in the lithographic structure, for example these materials can be used as a hardmask layer; an anti-reflection layer, such as a BARC; or as a combined hardmask/anti-reflection layer. The GeOHX films of the present invention may act as an anti-reflection layer in any lithographic process. Examples of lithographic processes include, but are not limited to, 248 nm, 193 nm, 157 nm, 126 nm, extreme UV, and electron beam.

A multilayer lithographic structure according to the present invention includes a substrate having on a surface thereof a first layer. The first layer includes one or more layers of a material which includes Ge, O, and H, and optionally X, wherein X is selected from at least one of Si, N, and F. The first layer is water and/or aqueous base soluble. The first layer has thereon a second layer, which includes an energy photoactive material.

When the first layer includes more than one layer of a material which includes Ge, O, and H, and optionally X, wherein X is selected from at least one of Si, N, and F, the multiple layers, or films, may be of the same composition of GeOHX or of a different composition of GeOHX. This allows for the fine tuning of the optical constants of the first layer throughout its thickness. The optical constants of the first layer can therefore substantially match those of the substrate at a first interface between the first layer and the substrate, as well as, substantially match the optical properties of the second layer at a second interface between the first layer and the second layer. The optical properties at the imaging wavelengths, such as 248, 193 or 157 nm and the lithographic features of the film produced by the present invention are vastly superior to those obtained by other hardmask materials such as oxide type materials (TEOS, BSG) and nitride type materials (H. C. Lee, J. Vac. Sci. Technol., vol. 16, No. 5, p. 2763, 1998, J. F. Rembetski, Solid State Technol. Vol. 38, No. 3, p 67, 1995). For example, a Si substrate coated with a thick planarizing-ARC-hard mask GeOHX material of this invention drastically reduces thin film interference and substrate reflectivity, which consequently improves CD control.

It is possible to vary the optical properties of the first layer over a wide range of values. For example, optimum values for the index of refraction, n, the extinction coefficient, k, and layer thickness can be obtained by modeling multilayer lithographic. Knowledge of the optical constants of the entire film structure is important to compute the minimal reflectance at the interface between the first layer and the second layer and the interface between the first layer and the substrate. Computations are based on algorithms which use the Fresnel coefficients as found in standard textbooks such as Optics, by E. Hecht and A. Zajac, published in 1979 by Wiley, pages 312 and 313. The preferred optical constants of the films of the first layer are an index of refraction of between about 1.4 to about 2.6 and extinction coefficient of between about 0.01 to about 1. More preferably the index of refraction is between about 1.58 and 2.0 and the extinction coefficient is between about 0.01 and 0.8 at various imaging wavelengths. Table 1 includes example n and k values for various GeOHX films. More commonly, the k values were between 0.15 and 0.6 at the imaging wavelength.

The first layer can be any thickness that provides the desired optical properties. Preferably the thickness of the first layer is between about 200 Angstroms and about 5,000 Angstroms. More preferably the thickness of the first layer is between about 350 Angstroms and about 3,000 Angstroms depending on film absorption.

TABLE 1

Variation of n and k values at 193 nm and 248 nm of GeOHX ARC/hardmask PECVD films deposited at various plasma chemistries and deposition conditions showing the tunability of the antireflective properties of these materials.

| Film Composition | Optical Constants | | | | | |
|---|---|---|---|---|---|---|
| | $n_{157\,nm}$ | $k_{157\,nm}$ | $n_{193\,nm}$ | $k_{193\,nm}$ | $n_{248\,nm}$ | $k_{248\,nm}$ |
| GeOH | — | — | 1.769 | 0.081 | 1.581 | 0.005 |
| GeOHX | — | — | 1.841 | 0.467 | 1.929 | 0.127 |
| GeOHX | — | — | 1.911 | 0.138 | 1.767 | 0.017 |
| GeOHX | — | — | 1.842 | 0.532 | 1.957 | 0.164 |
| GeOH | — | — | 2.024 | 0.237 | 1.876 | 0.07 |
| GeOH | — | — | 1.907 | 0.346 | 1.817 | 0.048 |
| GeOHX | — | — | 1.966 | 0.387 | 1.948 | 0.256 |
| GeOHX | — | — | 1.932 | 0.691 | 2.089 | 0.567 |
| GeOHX | 1.567 | 0.829 | 1.795 | 0.775 | | |

The second layer includes an energy photoactive material. This energy photoactive material may be a resist material. The resist material may be a chemically amplified resist material or any known energy photoactive material. Examples of suitable energy photoactive materials include, but are not limited to, IBM/JSR ARF AR series, such as AR165J and AR237J; JSR ESCAP chemistries KRF M series, such as M20G; Shipley Epic V40 and Epic S7 193 nm photoresists; Shipley UVx series, such as UV8, UV110 and other acrylates; cyclic olefin/maleic anhydride; VEMA; cyclized polymer based commercial 193 nm photoresists; and any combinations thereof. The energy active material can be sensitive to any suitable energy. Examples of suitable energies include, but are not limited to, 248 nm, 193, nm, 157 nm, 126 nm, extreme ultraviolet, electron beam, ion beam, and x-ray.

The thickness of the second layer will vary depending on the material chosen and the lithographic process, and can be any suitable thickness. The thickness of the second layer is preferably between about 1,000 Angstroms and about 3,000 Angstroms, and more preferably between about 250 Angstroms (A) and about 6,000 Angstroms (A).

The first layer can be a hardmask layer, an anti-reflection layer, or a combined hardmask/anti-reflection layer. It is also possible that a third layer may be interposed between the first layer (GeOHX layer) and the second layer (energy photoactive layer). An example of a suitable third layer includes, but is not limited to, an anti-reflective coating, such as a BARC. When the first layer is used as a hardmask layer alone, such a BARC would be useful. The third layer can be a spin-coated polymeric BARC or a chemical vapor deposited BARC. A preferred third layer is an antireflective coating that includes R, C, O, and H, wherein R is selected from the group consisting of: Si, Ge, Ti and any combinations thereof (an RCOH layer).

A preferred RCOH layer includes a polymer having SiO moieties in its backbone. The polymer is preferably an organosiloxane, more preferably organosilsesquioxane. In general, the polymer preferably contains one or more monomers having structures selected from (I)–(III) below:

(I)

where x is from about 1 to about 1.5. $R_1$ comprises a chromophore moiety; $R_2$ comprises a transparent moiety; $R_3$ comprises a reactive site for reaction with a crosslinking component. For linear organosiloxane polymers, x would equal about 1. For silsesquioxane polymers, x would equal about 1.5. In some instances, multiple functional moieties may be present on the same monomer (e.g., a reactive group and a chromophore). Generally, silsesquioxane polymers are preferred on the basis of superior etch resistance. If the ordinary organosiloxane polymers are used, then preferably, the degree of crosslinking is increased compared to formulations based on silsesquioxanes. These polymers and processes for spin-coating films containing such polymers are described in the commonly-owned, co-pending U.S. application Ser. No. 10/124,087, filed on Apr. 16, 2002, entitled "Antireflective Si-Containing Compositions For Hardmask Layer," the contents of which are incorporated herein by reference in their entirety as if fully set forth.

Examples of SiO containing polymers include: poly(3-propanoloxypropyl)silsesquioxane, copolymer of 3-propanoloxypropylsilsesquioxane and phenylsilsesquioxane, blend of poly(hydroxybenzyl)silsesquioxane and poly(1-hydroxy-1-trifluoromethylethyl) silsesquioxane, copolymer of 1-hydroxy-1-trifluoromethylethylsilsesquioxane and p-Hydroxymethylbenzylsilsesquioxane.

A fourth layer may be interposed between the first layer (GeOHX layer) and the substrate. Examples of suitable fourth layers include, but are not limited to, a sacrificial hard mask layer, a capping layer and any combinations thereof. When the first layer is used as an anti-reflective coating alone, such a hard mask layer would be useful.

The substrate can be any substrate suitable in lithographic structures. Examples of suitable substrates include, but are not limited to, a semiconductor, a dielectric, a polymer, a glass, a metal, nonmetallic conductor, magnetic material and any combinations thereof. Examples of preferred materials for the substrate include, but are not limited to, Si, Ge, SiGe, polymers, oxide, nitride, metal and any combinations thereof.

The Ge, O, H, and X elements of the first layer (GeOHX layer) can be present in any atomic percent ratio. The preferred atomic percent (at. %) ranges for the Ge, O, H, and X elements are given as follows:

For Ge, the atomic percent range is preferably from about 15 at. % to about 40 at. %, more preferably from about 17 at. % to about 35 at. %, and most preferably from about 20 at. % to about 30 at. %.

For O, the atomic percent range is preferably from about 15 at. % to about 85 at. %, more preferably from about 20 at. % to about 60 at. %, and most preferably from about 40 at. % to about 50 at. %.

For H, the atomic percent range is preferably from about 5 at. % to about 55 at. %, more preferably from about 10 at. % to about 45 at. %, and most preferably from about 15 at. % to about 30 at. %.

For X, the atomic percent range is preferably from about 0 at. % to about 50 at. %, more preferably from about 1 at. % to about 30 at. %, and most preferably from about 2 at. % to about 10 at. %.

The first layer has minimum to no interfacial interaction with the second layer and has good resolution down to 50 nm. The interface between first and second layers is substantially free of any undesirable chemical interactions, physical interactions, adhesion problems, and interfacial mixing.

The first layer has good etch selectivity to conventional energy photoactive materials, such as deep UV photoresists. Etch selectivities of the first layer to second layer range from about 10:1 to about 1:1, preferably are greater than about 1:1, and more preferably greater than about 2:1. The first layer is patternable by reactive ion etching in gas chemistry. Examples of suitable gasses include, but are not limited to oxygen, fluorine, chlorine, bromine, hydrogen and any combinations thereof. Example etch selectivities of 1.5:1 to 4:1 were obtained using a halogen and/or fluorocarbon-based chemistry in conjunction with a high-density plasma etcher. This will prevent the excessive photoresist loss observed in conventional ARC-open etches and allow thin resist process. The etch selectivity of the first layer to the substrate range from about 10:1 to about 1:1, preferably are greater than about 1:1, and more preferably greater than about 3:1.

The reflectance between the first layer and the second layer can be minimized by the use of the films of the present invention. Preferably the reflectance between the first and second layers is less than about 0.5%, and more preferably less than about 0.01%.

In one embodiment of the present invention, the optical, chemical, and physical properties of the first layer are not impacted or are impacted minimally by exposure to applied irradiation.

GeOHX films are water and aqueous base soluble and can be selectively removed from the structure without any substrate degradation or damage.

The first layer (GeOHX layer) can be deposited by various known methods. Examples of such methods include, but are not limited to, vapor deposition, plasma enhanced chemical vapor deposition, high density plasma, sputtering, ion beam, electron beam, laser assisted techniques, spin-coating and any combinations thereof.

The films of the first layer may be deposited from precursors. Examples of suitable precursors include, but are not limited to, germane, alkyl germane, alkoxy germane, acyloxy germane, aryl germane, cyclic germane, silicon containing precursor, oxygen containing precursor, nitrogen containing precursor, fluorine containing precursor, sulfur containing precursor, carbon dioxide, carbon monoxide, hydrogen and any combinations thereof.

In a preferred example, the films of the first layer are deposited by chemical vapor deposition (CVD), such as plasma enhanced chemical vapor deposition (PECVD) techniques. In one type of technique the PECVD process is performed in a parallel plate reactor where the substrate is placed on one of the electrodes. In the following embodiment examples the substrate is placed on the powered electrode of a parallel plate PECVD reactor, therefore acquiring a negative bias.

Table 2 includes non-limiting exemplary embodiments of films deposited under the listed conditions.

TABLE 2

| Example | Film/Layer Type | Precursor | Pressure in Reactor | Substrate T | Substrate Bias |
|---|---|---|---|---|---|
| 1 | GeOHX | tetramethylgermane at a flow of 5 sccm mixed with oxygen at a flow of 30 sccm | 100 mtorr | 60° C. | −150 V |
| 2 | GeOHX | tetramethylgermane at a flow of 10 sccm mixed with oxygen at a flow of 10 sccm | 100 mtorr | 60° C. | −50 V |
| 3 | GeOHX | tetramethylgermane at a flow of 5 sccm mixed with oxygen at a flow of 50 sccm | 100 mtorr | 60° C. | −250 V |
| 4 | GeOHX | tetramethylgermane at a flow of 10 sccm mixed with oxygen at a flow of 100 sccm | 100 mtorr | 60° C. | −150 V |
| 5 | GeOHX | tetramethylgermane at a flow of 10 sccm mixed with $C_6H_{12}$ at a flow of 1.8 sccm | 100 mtorr | 60° C. | −150 V |
| 6 | GeOHX | tetramethylgermane at a flow of 10 sccm with tetramethylsilane at a flow of 10 sccm | 100 mtorr | 60° C. | −200 V |
| 7 | SiCOH | tetramethylsilane at a flow of 10 sccm mixed with oxygen at a flow of 2 sccm | 200 mtorr | 180° C. | −200 V |
| 8 | GeOHX | tetramethylgermane at a flow of 15 sccm mixed with oxygen at a flow of 2 sccm | 200 mtorr | 60° C. | −50 V |
| 9 | GeCHX | tetramethylgermane at a flow of 50 sccm with helium as a carrier gas at flow of 250 sccm | 2 Torr | 235° C. | Top electrode power = 400 W |
| 10 | GeOHX | tetramethylgermane at a flow of 50 sccm with helium as a carrier gas at flow of 250 sccm mixed with CO2 at a flow of 100 sccm | 2 Torr | 235° C. | Top electrode power = 400 W |

Other examples of PECVD methods include a parallel plate PECVD reactor with the substrate positioned on the grounded electrode. The films can be deposited in conditions similar to those described in the previous examples but at substrate temperatures up to 400° C., and in high density plasma type reactors under suitable chosen conditions. The films may also be deposited in a dual RF frequency PECVD reactor with the top RF power being from about 50 to about 2000 W and bottom RF power from about 0 to about 200 W.

It should be noted that by changing process parameters such as bias voltage, gas flow, pressure and deposition temperature, the optical constants of the film can be varied. In addition, the composition of the starting precursor as well as the introduction of oxygen, nitrogen, fluorine, silicon and carbon containing precursors also allows the tunability of these films.

The films of the first layer may also be deposited by spin-coating from a solgel derived process. For example, germanium, silicon, nitrogen, and fluorine containing precursors are hydrolyzed by acid in an organic solvent. This solution can then be spin applied onto the substrate followed by a bake to give the desired coating. The advantage of a spin-applied coating is its planarizing/gapfilling property, unlike CVD deposited films which are conformal. Many backend dual damascene structures contain via that need to be gapfilled and planarized prior to lithography. Complete gapfill of via structure is necessary to prevent the formation of voids in the via that would otherwise lead to structural defects after the etch process. In addition, planar films avoid thickness changes that could impact the lithography and the subsequent etch transfer. A planarizing coating procedure, therefore avoids the use of a chemical mechanical polishing step to planarize the surface prior to lithography. Thus, for integration schemes, such as the via first integration scheme for fabricating backend dual damascene structures, planarizing GeOHX films are desirable.

Examples of suitable germanium and silicon containing precursors include, but are not limited to, $Ge(OR)_4$, $Si(OR)_4$, $HGe(R^1)_3$, $HSi(R^1)_3$, $HGe(OR)_3$, $HSi(OR)_3$ and any combinations thereof, wherein R is selected from the group consisting of: methyl, ethyl, isopropyl, isobutyl, n-butyl and any combinations thereof, and wherein $R^1$ is a halogen.

The spin-coated films of the first layer may be highly cross-linked networks of Ge, O, and H, and optionally X. These films of the first layer can include functional groups represented by the formulas:

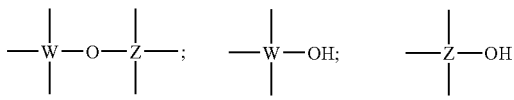

or any combinations thereof, wherein W and Z can be independently Ge, Si, N, and F.

The fewer

functional groups, the higher the degree of cross-linking in the film. The

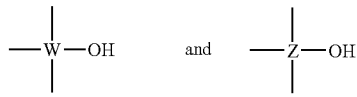

functional groups are preferably present in a mole percent from about 1% to about 50%, more preferably in a mole percent of less than about 10%, and most preferably in a mole percent of less than about 5%, based on the total film.

It should be noted that in addition to the first layer, a third layer, such as a cap layer including the RCOH material discussed above, may be deposited between the first layer and the second layer. This third layer may be CVD deposited or spin applied. After lithography, a pattern may be transferred into the third layer, followed by transfer of the pattern into the first layer. The second layer (energy photoactive layer) may be stripped off during any of these etch steps. The third layer may be consumed during the open of the dielectric layer (substrate). After completion of the etch process, the first layer may be stripped of by water or aqueous base.

The present invention further provides a method of making a lithographic structure which includes depositing on a surface of a substrate a first layer including a water and/or aqueous base soluble material which includes Ge, O, and H, and optionally X, wherein X is at least one of Si, N, and F; and depositing on the first layer a second layer which includes an energy photoactive material.

The depositing of the first layer may be repeated one or more times by depositing one or more of same or different layers which include Ge, O, and H, and optionally X, wherein X is at least one of Si, N, and F.

The index of refraction and the extinction coefficient of said first layer can be finely tuned to substantially match those of the substrate at a first interface between the first layer and the substrate and to substantially match those of the second layer at a second interface between the first layer and the second layer. This fine tuning is achieved as discussed above in relation to the lithographic structure.

A third layer may be deposited between the first layer and the second layer. The depositing of the third layer would occur after depositing of the first layer and before depositing of the second layer. The third layer may include an anti-reflective coating as discussed above with respect to the lithographic structure.

A fourth layer may be deposited between the first layer and the substrate. The depositing of the fourth layer would occur before depositing of the first layer. The fourth layer may include a sacrificial hard mask and/or capping layer as discussed above with respect to the lithographic structure.

The first layer can be deposited by any known technique. Suitable deposition techniques include, but are not limited to, vapor deposition, high density plasma, plasma enhanced chemical vapor deposition, sputtering, ion beam, electron beam, and laser assisted techniques.

The first layer may be deposited by plasma enhanced chemical vapor deposition from a precursor. Suitable precursors are discussed above in relation to the lithographic structure. The first layer may also be deposited by spin-coating as discussed above with respect to the lithographic structure.

The method of making a lithographic structure according to the present invention may further include the step of etching a pattern into the first layer after the step of depositing the second layer. The pattern can be formed by first forming a pattern in the second layer and thereafter transferring the pattern to the first layer. The pattern may be transferred into the first layer by reactive ion etching in a plasma including a component selected from the group consisting of: fluorine, chlorine, bromine, fluorocarbon, oxygen, CO, CO2, nitrogen, helium, argon, hydrogen and any mixtures thereof. Subsequent to the transfer of the pattern into the first layer, the pattern may be transferred into the substrate material and then the first layer may be removed. The first layer may be removed by a water and/or aqueous base.

The following examples are given to illustrate the scope of the present invention. Because these examples are given for illustrative purposes only, the invention embodied therein should not be limited thereto.

EXAMPLE 1

FIG. 1 shows four examples of basic lithographic structures according to the present invention. FIG. 1(a) shows a lithographic structure according to the present invention. A substrate 10 has thereon a first layer 12 which includes a water and/or aqueous base soluble material which includes Ge, O, and H, and optionally X, wherein X is at least one of Si, N, and F (GeOHX layer). This GeOHX layer or first layer has thereon a second layer 14, which comprises an energy photoactive material. FIG. 1(b) shows a lithographic structure where the first layer 12 is made up of one or more of the same or different layers 16, 18, 20, and 22 which include Ge, O, and H, and optionally X, wherein X is at least one of Si, N, and F. It should be understood that the first layer 12 can have a single GeOHX layer or any number of GeOHX layers. FIG. 1(c) shows a lithographic structure where a third layer 24 is interposed between the first layer 12 and the second layer 14. FIG. 1(d) shows a lithographic structure where a fourth layer 26 is interposed between the first layer 12 and the substrate 10.

EXAMPLE 2

This example illustrates the removal of GeOHX materials in water and aqueous base solutions. The removal rates of GeOHX films were evaluated by measuring the dissolution rates using a quartz crystal microbalance (QCM). QCM is a standard technique used to determine the dissolution rate. Detailed description of this technique can be found in article by K. K. Kanazawa, W. D. Hinsberg *Rev. Sci. Instrum.* 60

Figure 2A:
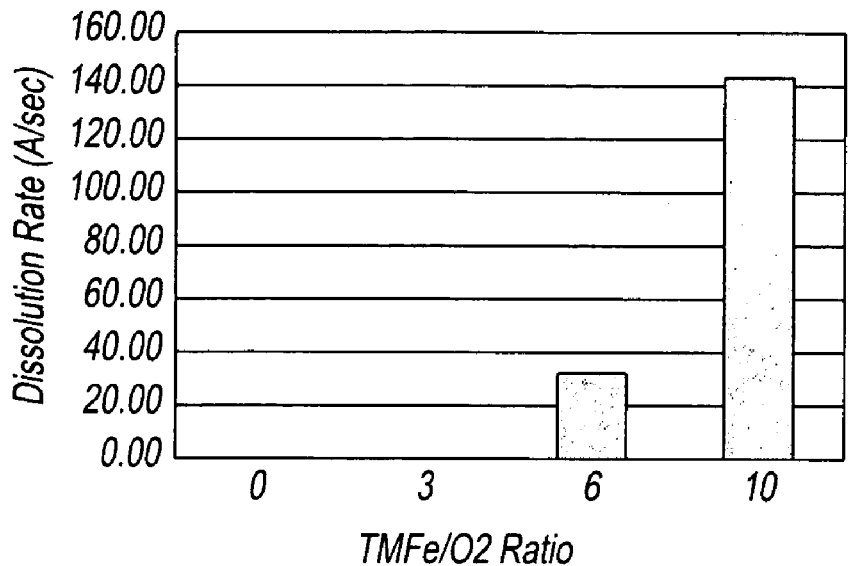
FIG. 2(a) shows the dissolution rates (A/sec) of GeOHX materials in water as a function of TMGe to O2 ratio.
Figure 2B:
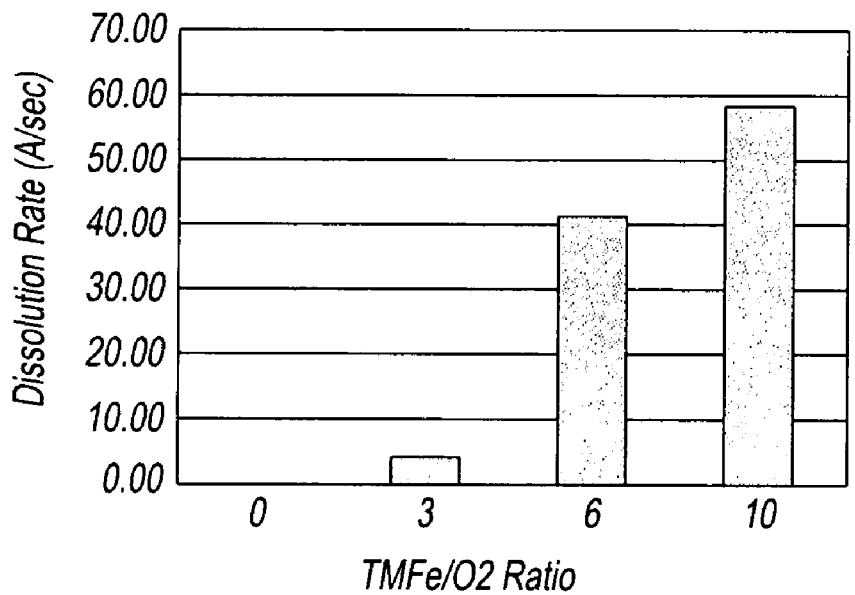
FIG. 2(b) shows the dissolution rates (A/sec) of GeOHX materials in 0.26N tetramethylammoniunhydroxide (TMAH) aqueous base solution as a function of TMGe to O2 ratio.

(1989) 489–492. Dissolution rates in water and 0.26N tetramethylammoniunhydroxide (TMAH) aqueous base solution have been evaluated. Dissolution rates of GeOHX films deposited under the conditions as described in the embodiments above using pressure of 100 mTorr, bias of −150V and varying TMGe to oxygen ratio from 0 to 10 have been measured. FIG. 2(a) shows the dissolution rates (A/sec) of GeOHX materials in water as a function of TMGe to O2 ratio. FIG. 2(b) shows the dissolution rates (A/sec) of GeOHX materials in 0.26N tetramethylammoniunhydroxide (TMAH) aqueous base solution as a function of TMGe to O2 ratio. It should be noted that solubility increases with the increase of oxygen content of the films. Substrate materials such as silicon oxide, silicon nitride and polysilicon are not soluble in water or aqueous base solution thus GeOHX can be selectively removed from the structure without any substrate degradation or damage.

EXAMPLE 3

Figure 3A:
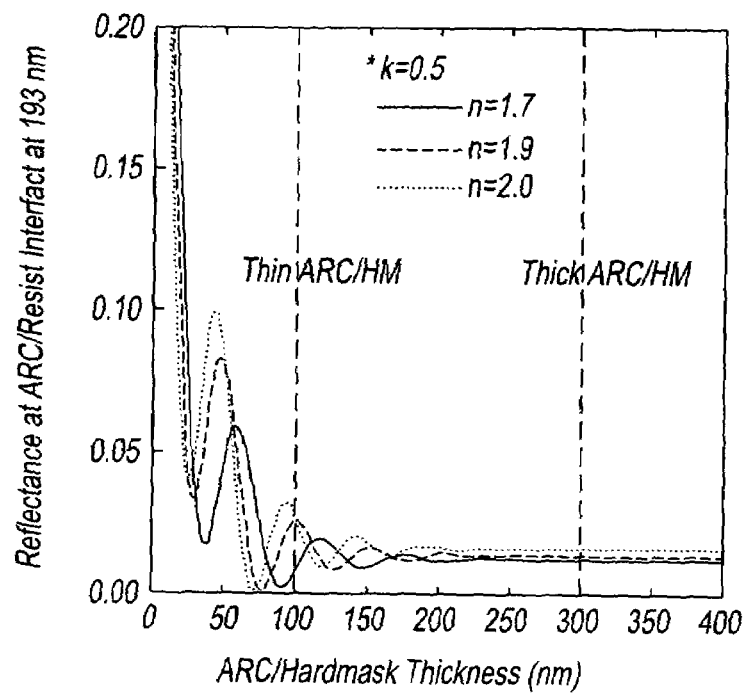
FIG. 3(a) shows reflectance at ARC-hardmask/resist interface at 248 nm as a function of ARC thickness for different values of refractive index (n) using a fixed value of k=0.25.
Figure 3B:
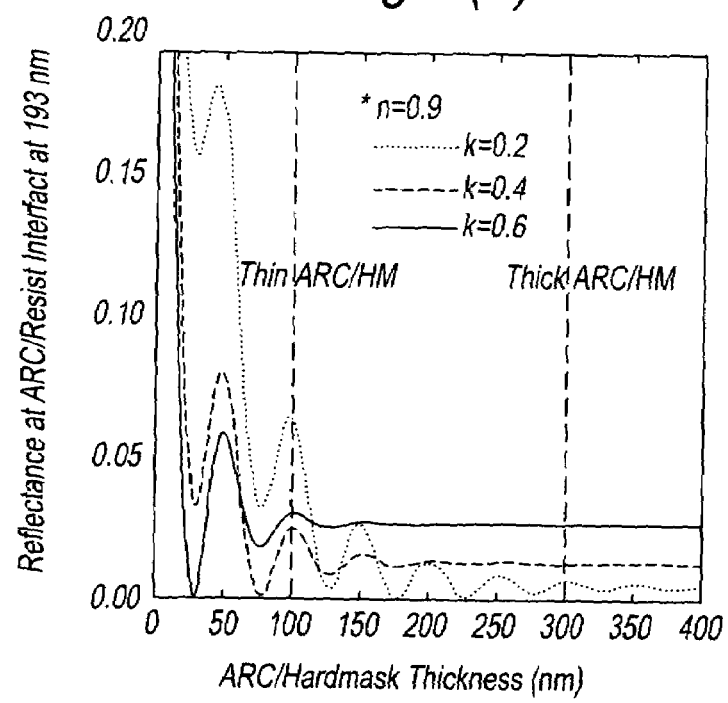
FIG. 3(b) shows reflectance at ARC-hardmask/resist interface at 248 nm as a function of ARC thickness for different values of extinction coefficient (k) using a fixed value of n=1.75.

The following example illustrates calculations for obtaining optimum optical constants and thickness of a GeOHX film to be used as an ARC/Hardmask layer. Parameters are optimized so as to reduce reflections at the ARC/resist interface. Computations are based on algorithms which use the Fresnel coefficients as found in standard textbooks such as Optics, by E. Hecht and A. Zajac, published in 1979 by Wiley, pages 312 and 313. These simulations can be extended to many different structures and they are not limited by the examples given below. The structure simulated in this example includes a Si substrate, GeOHX ARC-hard mask layer and photoresist. The parameters under investigation are the ARC-hard mask layer optical constants n and k and film thickness d. The acrylate-based 193 nm resist used in this study has n=1.72 and k=0.018 at 193 nm. The reflectance at the ARC/resist interface of thin ARCs of ~100 nm exhibits alternating maxima and minima, the positions of which depend on the n and k of the ARC/hardmask film. FIG. 3(a) shows the reflectance at the ARC/resist interface at 193 nm as a function of ARC/hardmask thickness for different values of n while keeping k constant at 0.5. High values of n and k, on the order of 2.0–2.1 and 0.5–0.6 respectively, are desirable for thin ARCs in order to minimize the thickness at the second minimum. While thin absorbing ARCs, operating at a reflectance minimum, can significantly suppress the reflectivity for a particular substrate; they are not as effective if the substrate thickness varies, or if there is significant topography on the wafer. Conversely, thick ARCs of ~300 nm, can provide better reflectivity control due to the small variation in reflectance caused by substrate reflectivity changes. FIG. 3(b) shows the reflectivity at the ARC/resist interface at 193 nm versus ARC thickness for different k values while keeping the value of n fixed. In this case, the extinction coefficient has a stronger impact on reflectance versus that of the index of refraction. The ARC film with n values in the range of 1.70 to 1.95 and k of ~0.20 to 0.22 will provide minimal thin film interference at this interface.

EXAMPLE 4

This example illustrates how to form layered (graded) GeOHX films to achieve a significant reduction in reflectivity at ARC/resist interface. In a multiple film first layer structure (FIG. 1(b)), the index of refraction (n) and the extinction coefficient (k) are graded throughout the first layer thickness to match the adjacent layers, if n and k of the first layer are perfectly matched to the adjacent layers, in principle, there should be no reflection at the interface between the first layer and the second layer. Variation in optical constants of GeOHX films was achieved by varying the precursor's composition, deposition conditions, as well as by doping films with different additives as described in the embodiments above. Table 1 shows the optical constants of different GeOHX materials. The index of refraction of GeOHX films was varied from about 1.58 to about 2.0 and the extinction coefficient from about 0.01 to 0.8 at various imaging wavelengths enabling a graded first layer structure.

Figure 4:
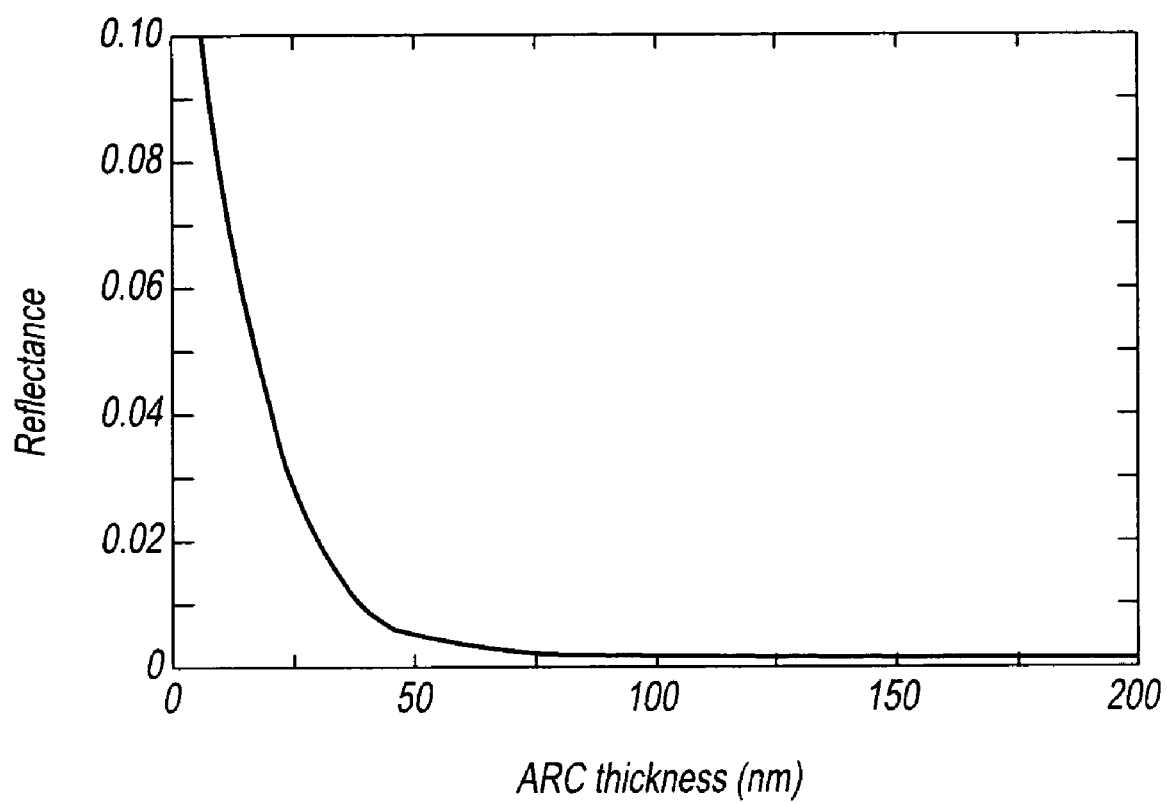
FIG. 4 shows reflectance at ARC-hardmask/resist interface at 193 nm as a function of ARC thickness for graded (layered) GeOHX material.

We consider the example that shows significant reflectivity minimization by using a RCOH layer between a GeOHX and a resist. In this example, first, a 1000 A thick GeOHX film with n=1.845 and k=0.532 at 193 nm is deposited onto an Si substrate using process conditions as described in the deposition process in table 2, example 1 but using the substrate bias of −250V, and then, a 270 A thick SiCOH film with n=1.8 and k=0.22 is deposited using a process condition as described in U.S. Pat. Nos. 6,316,167 and 6,514,667. FIG. 4 represents a reflectance at the interface between the ARC/hardmask and the resist at 193 nm for this structure. A significant reflectivity reduction (about 0.0001), as well as insensitivity to hardmask thickness variation verses a single layer ARC/hardmask can be achieved by using tunable (layered) hardmask process which are show in FIG. 4.

EXAMPLE 5

Figure 5A:
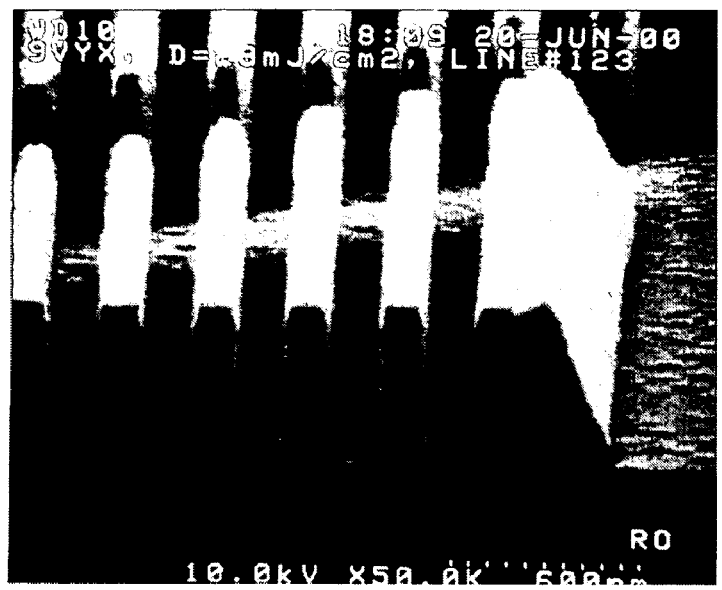
FIG. 5(a) shows SEM image of half-pitch line-and-space structures patterned on single layer GeOHX ARC/hardmasks material using UV82 at 248 nm giving 150 nm resolution.

The following example is given to demonstrate the performance of GeOHX films as an ARC/hardmask layer for advanced resist process. The following example also demonstrates the formation of device features of 0.2 μm (micron not mm) and below using a GeOHX vapor deposited ARC/hardmask material. A GeOHX film was deposited as described in the deposition process described in Table 2, example 1 onto 8" wafer. A 248 nm resist (Shipley UV82 resist) was spun on the top of the GeOHX film and post-apply baked. Then the resist was exposed to 248 nm radiation at a dose of about 28 mJ/cm2 using ASML microstepper and post-exposed baked. Then the resist is developed in LDD26W Shipley developer. FIG. 5(a) shows cross-sectional SEM image of 150 nm L/S developed resist profiles on a PECVD deposited single layer GeOHX ARC/hardmask film and shows no residue at the resist/GeOHX film interface. A resist is about 6,000 Angstroms and the GeOHX film thickness is about 2,400 Angstroms.

Figure 5B:
FIG. 5(b) shows SEM image of high resolution half-pitch line-and-space structures patterned on multilayer SiCOH/GeOHX material using 193 nm resist giving 100 nm resolution.

The feasibility of using graded (layered) GeOHX ARC/hardmask for 193 nm lithography was also demonstrated. Graded (layered) GeOHX ARC/hardmask material as described in Example 4 was deposited onto 8" wafer. Commercial 193 nm resist was spun on top, followed by 193 nm imaging and development as described above. FIG. 5(b) shows cross-sectional SEM image of sub-150 nm L/S patterns over graded GeOHX structure.

EXAMPLE 6

Figure 6:
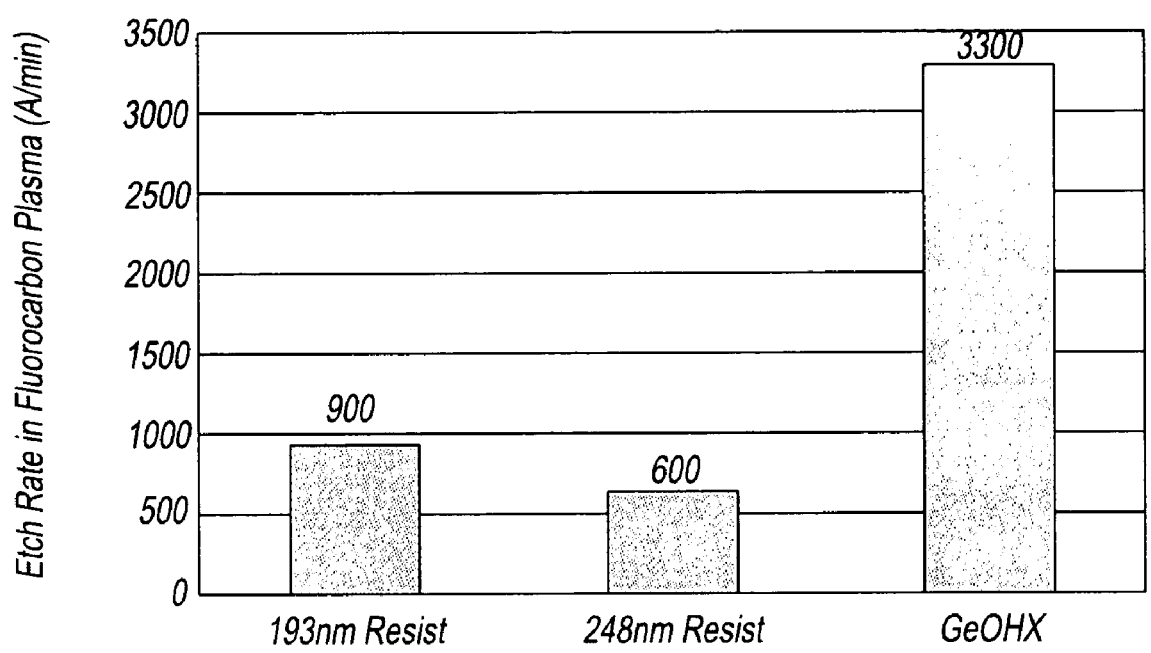
FIG. 6 shows blanket etch rates of GeOHX ARC/hardmask and two photoresists in a fluorocarbon based plasma chemistry.
Figure 7A:
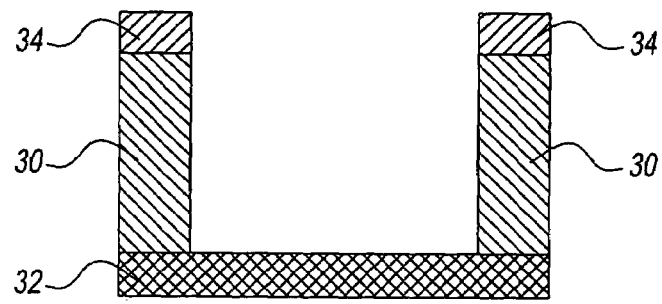
FIG. 7 shows a use and removal of a water and/or aqueous base soluble GeOHX ARC/hardmask material in a dual damascene integration scheme.
Figure 7B:
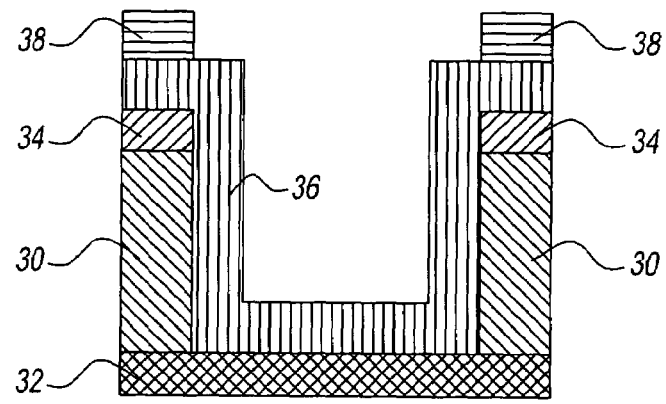
Figure 7C:
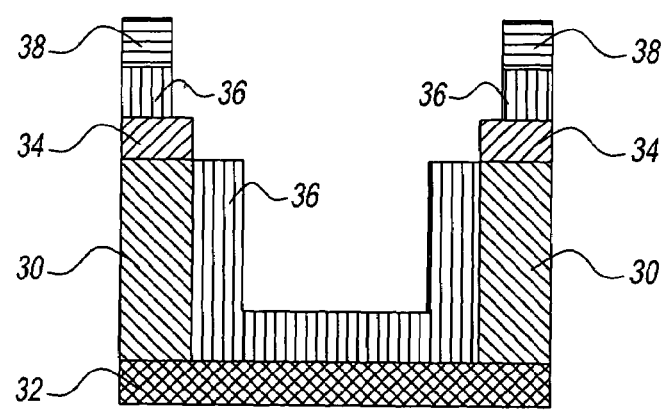
Figure 7D:
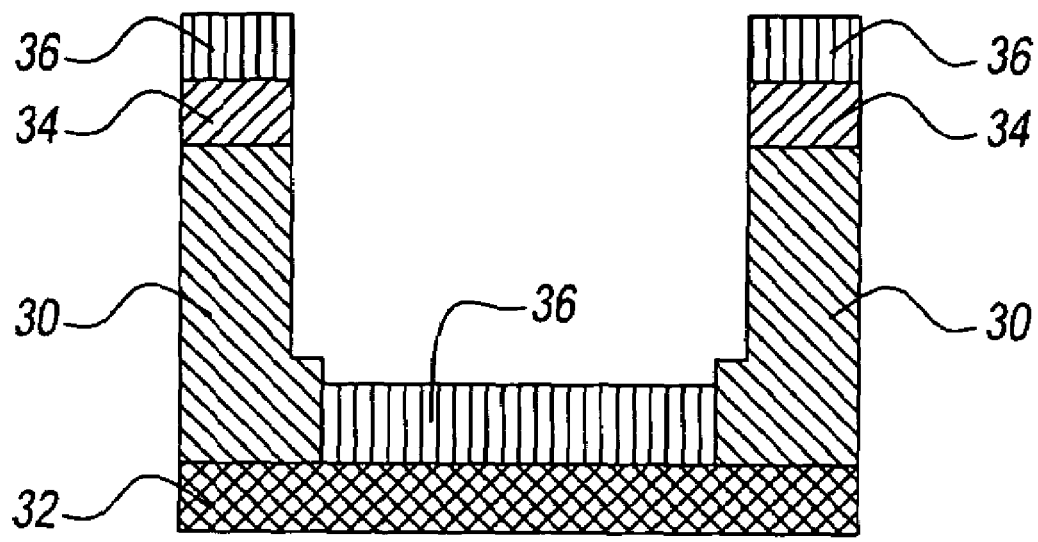
Figure 7E:
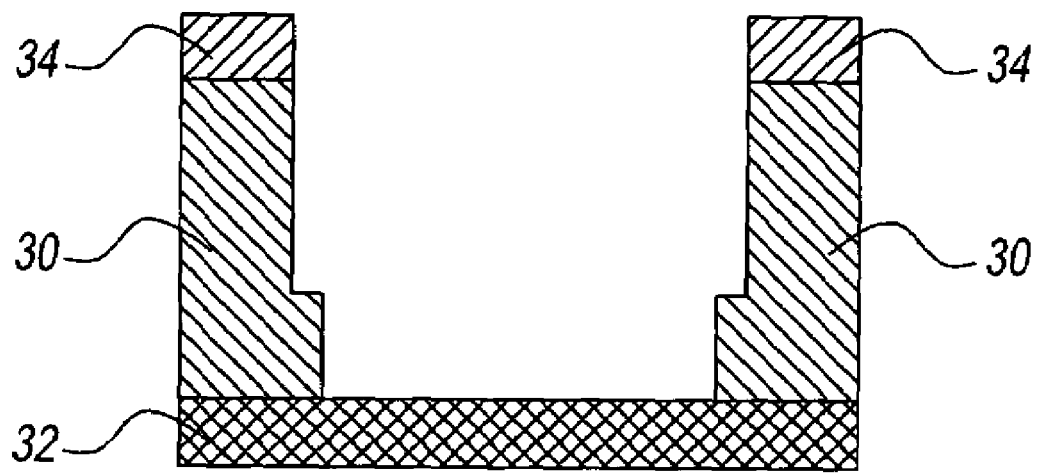
Figure 8A:
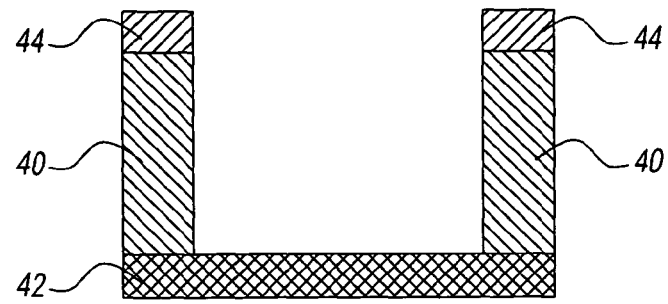
FIG. 8 shows a use of a water and/or aqueous base soluble GeOHX material as a planarizing spin-coated layer.
Figure 8B:
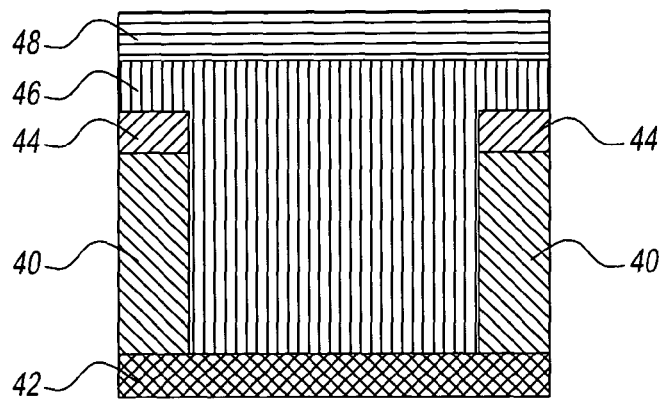
Figure 8C:
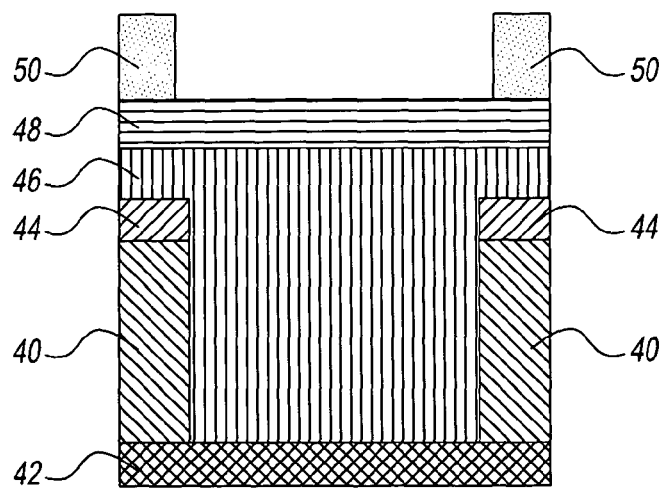
Figure 8D:
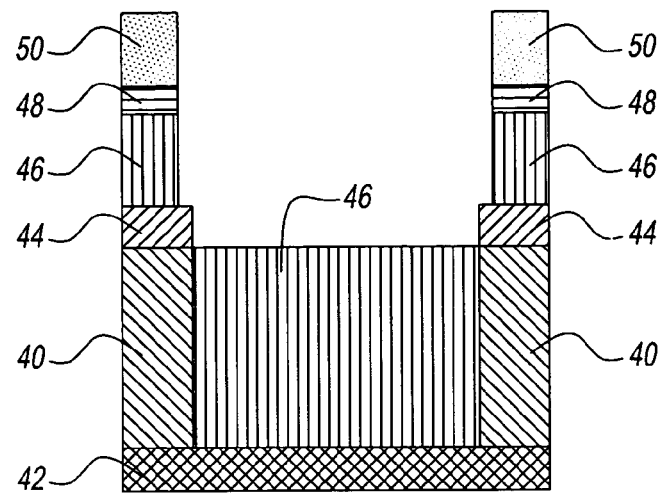
Figure 8E:
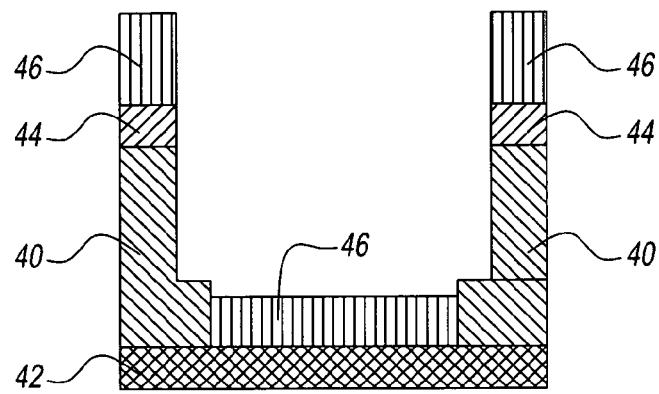
Figure 8F:
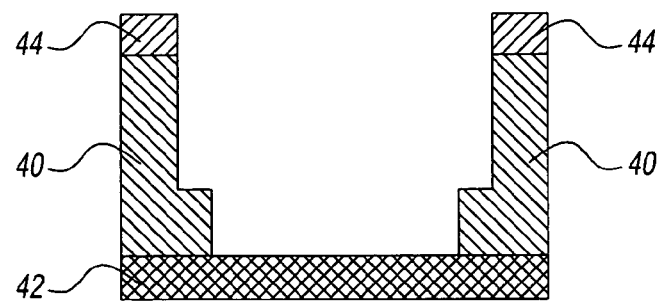

This example illustrates the etch selectivity of GeOHX materials to conventional deep UV and 193 nm photoresists. Having the appropriate etch selectivity to resist is among the most critical requirements of ARC/hardmask materials. Current organic ARCs have elemental chemical composition very similar to photoresists. This leads to little differentiation between the etch characteristics of these two material sets, resulting in a significant portion of the resist being consumed during the ARC open process. Thus, less resist remains for substrate etching. Furthermore, the organic ARC offers minimal etch-resistance during subsequent dielectric etch. For high-resolution lithography it is important to design ARC materials that will provide good etch selectivity to resist, as well as provide hardmask characteristics for the subsequent etch transfer. FIG. 6 shows the blanket etch rates of a GeOHX material compared with those of 248 and 193 nm resist films in a fluorocarbon based chemistry on a high-density plasma etch tool. The blanket selectivities of GeOHX material to 193 nm resist is about ~3.7:1 and to 248 nm resist is about ~5.5:1. This selectivity of more then 3 to 1 compares very favorably with the selectivity values of conventional organic ARC to resist of ~0.7.

EXAMPLE 7

The following example illustrates how the water and/or aqueous base soluble GeOHX ARC/hardmask material can be used and easily removed in a dual damascene process. Requirements to improve IC performance, such as faster clock speeds and lower power consumption, require the use of low-k materials for interconnects in chip manufacturing. However, the integration of low-k materials in a dual damascene process presents several technical challenges. Damage-free removal process of sacrificial masking materials after the patterning is complete is one of the key challenges (P. G. Clark et. al., Semiconductor International August, 2003 p 46–52).

FIG. 7 shows a diagram of the process flow for the dual damascene process. Incoming structure having an insulator substrate 30, such as low k or ultra low-k dielectric materials, deposited onto an etch stop substrate 32 containing a planarized metal line, and via is etched into the insulator by RIE process and then, capped with a cap material 34 to preserve the dielectric constant as shown in FIG. 7(a). A first layer 36 (water soluble GeOHX ARC/hardmask material) as described in previous examples is deposited over and the second layer 38 (photoresist) is spun on top, exposed and developed. FIG. 7(b) shows the diagram of Mx+1 level lithography. FIG. 7(c) shows the result of the first layer 36 being etched by fluorocarbon or halogen plasma, followed by a pattern transferred into the dielectric through the first layer 36 and cap material 34 (FIG. 6(d)). The second layer 38 and partially first layer 36 are also consumed during the $M_{x+1}$ open. FIG. 6(e) shows the result of the remaining first layer 36 being easily removed in water solution selective and damage-free to the low-k material 30 and etch-stop material 32. Water is known not to affect the dielectric properties of both low-k and etch-stop materials, and therefore quick removal of the ARC/HM material by a water-based strip process is highly desirable.

While the films in the examples above were prepared by plasma enhanced chemical vapor deposition (PECVD), similar films can be prepared by any radiation-assisted technique or by spin-coating. Such radiation-assisted techniques include, but are not limited to, PECVD, high density plasma (HDP), sputtering, ion beam, electron beam, and laser assisted techniques.

EXAMPLE 8

FIG. 8 shows an example of how a planarizing, spin-coated GeOHX material can be used. FIG. 8(a) shows an incoming structure having an insulator substrate 40, such as low k or ultra low-k dielectric materials, deposited onto an etch stop substrate 42, via is etched into the insulator, and the insulator is capped with a cap material 44. FIG. 8(b) shows a spin applied GeOHX material 46 that forms a planarizing layer and an RCOH layer 48. FIG. 8(c) shows the diagram of Mx+1 level lithography. The resist 50 has been applied, exposed, and developed. FIG. 8(d) shows the ARC/Hardmask open and FIG. 8(e) shows the Mx+1 open. The pattern is thus transferred to the insulator substrate. The resist 50 and the RCOH layer 48 have also been removed. FIG. 8(f) shows the results of the GeOHX material removal in water and/or aqueous base.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

What is claimed is:

1. A multilayer lithographic structure comprising a substrate, having on a major surface thereof a first layer which comprises a water and/or aqueous base soluble material consisting of: Ge, O, and H, and optionally X, wherein X is at least one of Si, N, and F; and disposed on said first layer a second layer which comprises an energy photoactive material.

2. The lithographic structure of claim 1, wherein said substrate is selected from the group consisting of: a semiconductor, a dielectric, a polymer, a glass, a metal, nonmetallic conductor, magnetic material and any combinations thereof.

3. The lithographic structure of claim 1, wherein said energy photoactive material is selected from the group consisting of: compositions which are photosensitive to 248 nm, 193 nm, 157 nm, 126 nm and extreme ultraviolet radiation, electron beam, ion beam, x-ray irradiation and any combinations thereof.

4. The lithographic structure of claim 1, wherein said first layer comprises one or more of same or different layers consisting of: Ge, O, and H, and optionally X, wherein X is at least one of Si, N, and F.

5. The lithographic structure of claim 4, wherein said first layer has an index of refraction and an extinction coefficient that are finely tuned to substantially match those of said substrate at a first interface between said first layer and said substrate and to substantially match those of said second layer at a second interface between said first layer and said second layer.

6. The lithographic structure of claim 5, wherein said index of refraction is tunable between from about 1.4 to about 2.6 and wherein said extinction coefficient is tunable from about 0.01 to about 0.78.

7. The lithographic structure of claim 1, wherein said first layer functions as a hardmask layer, an anti-reflection layer, or a combined hardmask/anti-reflection layer.

8. The lithographic structure of claim 1, wherein a third layer comprising an anti-reflective coating is interposed between said first layer and said second layer.

9. The lithographic structure of claim 8, wherein said anti-reflective coating R, C, O, and H, wherein R is selected from the group consisting of: Si, Ge, Ti and any combinations thereof.

10. The lithographic structure of claim 9, wherein said anti-reflective coating comprises a polymer comprising one or more functional groups selected from the group consisting of:

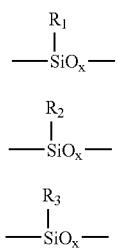

wherein x is from about 1 to about 1.5; $R_1$ comprises a chromophore moiety; $R_2$ comprises a transparent moiety; and $R_3$ comprises a reactive site for reaction with a crosslinking compound.

11. The lithographic structure of claim 1, wherein a fourth layer comprising a sacrificial hard mask and/or a capping layer is interposed between said first layer and said substrate.

12. The lithographic structure of claim 1, wherein said first layer is deposited by a technique selected from the group consisting of: vapor deposition, plasma enhanced chemical vapor deposition, high density plasma, sputtering, ion beam, electron beam, laser assisted techniques and any combinations thereof.

13. The lithographic structure of claim 1, wherein said first layer is deposited from a precursor selected from the group consisting of: germane, alkyl germane, alkoxy germane, acyloxy germane, aryl germane, cyclic germane, silicon containing precursor, oxygen containing precursor, nitrogen containing precursor, fluorine containing precursor, sulfur containing precursor, carbon dioxide, carbon monoxide, hydrogen and any combinations thereof.

14. The lithographic structure of claim 1, wherein said first layer comprises a material which comprises a functional group represented by the formula:

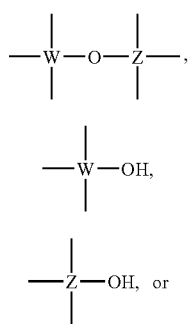

d) any combinations thereof, wherein W and Z are independently selected from the group consisting of: Ge, Si, N, and F.

15. The lithographic structure of claim 14, wherein said functional group b) and c) are present in a mole percent of less than about 5%.

16. The lithographic structure of claim 14, wherein said first layer is deposited by spin coating.

17. The lithographic structure of claim 14, wherein said first layer is deposited from a precursor selected from the group consisting of: $Ge(OR)_4$, $Si(OR)_4$, $HGe(R^1)_3$, $HSi(R^1)_3$, $HGe(OR)_3$, $HSi(OR)_3$ and any combinations thereof, wherein R is selected from the group consisting of: methyl, ethyl, isopropyl, isobutyl, n-butyl and any combinations thereof, and wherein $R^1$ is a halogen.

18. The lithographic structure of claim 1, wherein said first layer is patternable by reactive ion etching in a gas chemistry with an etch selectivity to said substrate that is greater than about 1:1.

19. The lithographic structure of claim 1, wherein said first layer comprises by atomic %: Ge from about 15 at. % to about 40 at. %; O from about 15 at. % to about 85 at. %; H from about 5 at. % to about 55 at. %; X from about 0 at. % to about 50 at. %.

20. The lithographic structure of claim 1, wherein the optical, chemical, and physical properties of said first layer are not impacted by exposure to an irradiation applied to said lithographic structure.

21. The lithographic structure of claim 1, wherein said second layer is a chemically amplified resist.

22. The lithographic structure of claim 1, wherein said second layer has a thickness from about 250 A to about 6000 A.

23. The lithographic structure of claim 1, wherein an etch selectivity of said second layer to said first layer is greater than about 1:1.

24. The lithographic structure of claim 1, wherein said lithographic structure is substantially free of interfacial interaction of said first layer and said second layer.

25. The lithographic structure of claim 1, wherein said lithographic structure has a reflectance at the interface between said first and second layers of less than about 0.01%.

26. A method of making a lithographic structure comprising: depositing on a surface of a substrate a first layer which comprises a water and/or aqueous base soluble material consisting of: Ge, O, and H, and optionally X, wherein X is at least one of Si, N, and F; and depositing on said first layer a second layer comprising an energy photoactive material.

27. The method of claim 26, wherein said depositing of said first layer is repeated one or more times by depositing one or more of same or different layers consisting of: Ge, O, and H, and optionally X, wherein X is at least one of Si, N, and F.

28. The method of claim 27, wherein the index of refraction and the extinction coefficient of said first layer are finely tuned to substantially match those of said substrate at a first interface between said first layer and said substrate and to substantially match those of said second layer at a second interface between said first layer and said second layer.

29. The method of claim 26, further comprising depositing a third layer comprising an anti-reflective coating between said first layer and said second layer.

30. The method of claim 29, wherein said layer between said first layer and said second layer is an antireflective coating layer different from said first layer and said second layer.

31. The method of claim 26, further comprising depositing a fourth layer comprising a sacrificial hard mask and/or capping layer between said first layer and said substrate.

32. The method of claim 26, wherein said first layer is deposited by a technique selected from the group consisting of: vapor deposition, high density plasma, plasma enhanced chemical vapor deposition, sputtering, ion beam, electron beam, and laser assisted techniques.

33. The method of claim 26, wherein said first layer is deposited by plasma enhanced chemical vapor deposition from a precursor selected from the group consisting of: germane, alkyl germane, alkoxy germane, acyloxy germane, aryl germane, cyclic germane, silicon containing precursor, oxygen containing precursor, nitrogen containing precursor, fluorine containing precursor, sulfur containing precursor, carbon dioxide, carbon monoxide, hydrogen and any combinations thereof.

34. The method of claim 26, wherein said first layer is deposited by spin-coating.

35. The method of claim 26, wherein said first layer is deposited from a precursor selected from the group consisting of: $Ge(OR)_4$, $Si(OR)_4$, $HGe(R^1)_3$, $HSi(R^1)_3$, $HGe(OR)_3$, $HSi(OR)_3$ and any combinations thereof, wherein R is selected from the group consisting of: methyl, ethyl, isopropyl, isobutyl, n-butyl and any combinations thereof, and wherein $R^1$ is a halogen.

36. The method of claim 26, further comprising etching a pattern into said first layer.

37. The method of claim 36, wherein said pattern is formed by first forming a pattern in said second layer and thereafter transferring said pattern to said first layer.

38. The method of claim 37, wherein said pattern is transferred into said first layer by reactive ion etching in a plasma comprising a component selected from the group consisting of: fluorine, chlorine, bromine, fluorocarbon, oxygen, CO, CO2, nitrogen, helium, argon, hydrogen and any mixtures thereof.

39. The method of claim 26, further comprising removing said first layer by water and/or aqueous base.

40. A film for a lithographic structure consisting of: Ge, O, and H, and optionally X, wherein X is at least one of Si, N, and F, and wherein said film is water and/or aqueous base soluble.

* * * * *